United States Patent
Wang et al.

(10) Patent No.: US 10,270,399 B2
(45) Date of Patent: Apr. 23, 2019

(54) MULTIPLEXED MULTI-STAGE LOW NOISE AMPLIFIER USES GALLIUM ARSENIDE AND CMOS DICE

(71) Applicant: TUBIS TECHNOLOGY INC, Pasadena, CA (US)

(72) Inventors: James Wang, Pasadena, CA (US); Yuh-Min Lin, San Ramon, CA (US); Kun-You Lin, Taipei (TW)

(73) Assignee: TUBIS TECHNOLOGY INC, Pasadena, CA (US)

( * ) Notice: Subject to any disclaimer, the term of this patent is extended or adjusted under 35 U.S.C. 154(b) by 0 days.

(21) Appl. No.: 15/451,096

(22) Filed: Mar. 6, 2017

(65) Prior Publication Data

US 2017/0237403 A1     Aug. 17, 2017

Related U.S. Application Data

(63) Continuation-in-part of application No. 14/881,998, filed on Oct. 13, 2015.

(51) Int. Cl.
*H03F 3/04*     (2006.01)
*H03F 1/30*     (2006.01)
(Continued)

(52) U.S. Cl.
CPC .......... *H03F 1/301* (2013.01); *H03F 1/0261* (2013.01); *H03F 1/0277* (2013.01); *H03F 1/26* (2013.01); *H03F 1/523* (2013.01); *H03F 1/56* (2013.01); *H03F 3/193* (2013.01); *H03F 3/211* (2013.01); *H03F 2200/18* (2013.01); *H03F 2200/222* (2013.01); *H03F 2200/294* (2013.01); *H03F 2200/387* (2013.01); *H03F 2200/408* (2013.01); *H03F 2200/411* (2013.01); *H03F 2200/414* (2013.01); *H03F 2200/444* (2013.01);
(Continued)

(58) Field of Classification Search
CPC .......... H03F 1/26; H03F 1/0277; H03F 1/523; H03F 3/193; H03F 3/211; H03F 3/04; H03F 3/343; H03F 3/345; H03F 2203/21127; H03F 1/30; H03F 2200/447; H03F 1/301; H03F 3/602; G05F 3/262
USPC ....... 330/256, 257, 288, 296, 266, 272, 289, 330/302
See application file for complete search history.

(56) References Cited

U.S. PATENT DOCUMENTS

7,091,790 B2 * 8/2006 Doherty .................... H03F 1/02
                                                            330/291
9,136,809 B2 * 9/2015 McMorrow ........... H03F 1/0261
(Continued)

*Primary Examiner* — Khanh V Nguyen
(74) *Attorney, Agent, or Firm* — Patentry; Peter G. H. Hwang (57) ABSTRACT

A gate bias circuit for a plurality of GaAs amplifier stages is a transistor coupled to a temperature compensation current received from a CMOS control stage. A plurality of pHEMPT amplifier stages are coupled to the gate bias circuit and to a control voltage which switches the amplifier stage. A selectively controlled stage pass transistor enables a current mirror between the gate bias circuit and each stage amplifying transistor. The penultimate pHEMPT amplifier stage is coupled to a CMOS amplifier. A CMOS circuit provides both the temperature compensation current by a proportional to absolute temperature (PTAT) circuit and the control voltage enabling each pHEMPT transistor to receive its input signal in combination with the gate bias voltage.

3 Claims, 9 Drawing Sheets

(51) Int. Cl.
*H03F 3/193* (2006.01)
*H03F 1/56* (2006.01)
*H03F 1/52* (2006.01)
*H03F 1/02* (2006.01)
*H03F 1/26* (2006.01)
*H03F 3/21* (2006.01)

(52) U.S. Cl.
CPC .. *H03F 2200/451* (2013.01); *H03F 2200/528* (2013.01); *H03F 2203/21103* (2013.01); *H03F 2203/21127* (2013.01); *H03F 2203/21139* (2013.01)

(56) References Cited

U.S. PATENT DOCUMENTS

2004/0090267 A1* 5/2004 Nagamori ............... H03F 1/301
 330/133
2004/0212436 A1* 10/2004 Matsunaga ........... H03F 1/0261
 330/285
2012/0112838 A1* 5/2012 Hase .................... H03F 1/0272
 330/288

* cited by examiner

MULTIPLEXED MULTI-STAGE LOW NOISE AMPLIFIER USES GALLIUM ARSENIDE AND CMOS DICE

CROSS-REFERENCES TO RELATED APPLICATIONS

This application is a continuation in part application of Ser. No. 14/881,998 which is incorporated by reference and benefits from its priority date Oct. 13, 2015.

STATEMENT REGARDING FEDERALLY SPONSORED RESEARCH OR DEVELOPMENT

Not Applicable

THE NAMES OF THE PARTIES TO A JOINT RESEARCH AGREEMENT

None.

INCORPORATION-BY-REFERENCE OF MATERIAL SUBMITTED ON A COMPACT DISK OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

Technical Field

The field of the invention is a low noise semiconductor amplifier with switching means for signal isolation and for externally controlling a bias voltage provided to each serial stage or to each parallel channel to compensate for extreme thermal responsivity.

Description of the Related Art

Kokubo teaches in U.S. Pat. No. 7,230,493 Bias Circuit with threshold voltage change compensation function and temperature change compensation function, a first and second temperature compensation circuit containing at least one diode. Additionally it offers a third temperature compensation circuit containing at least one diode. Each of the above temperature compensation circuits are attached to active elements i.e. transistors used for threshold voltage change compensation. At least two active elements (transistors) and two diodes are disclosed at a minimum because the invention compensates for both threshold voltage and temperature changes. This is unnecessarily complex.

Kevin Kabayashi IEEE Transactions on Microwave . . . Vol 44 No 2 Feb. 1996 teaches a monolithic DC Temperature Compensation Bias For Multistage HEMT ICs. The design incorporates a current mirror scheme. The motivation in part is to support space qualified applications which cause hybrid circuits containing discrete silicon regulators, capacitors, resistors and bond wires to be excessively costly in manufacture. Kobayashi overcomes the problems of current regulators applied to each HEMT transistor. However Kobayashi depends on a master or reference HEMT to set a current which is driven out to slave HEMTs by an HEMT op-amp. However the use of HEMT op-amps may not be cost effective and the current rather than the desired gain is kept constant.

Younsub Noh ETRI journal Volume 31 Number 3 June 2009 teaches a Power Amplifier MMIC with On-Chip Active Gate Bias Circuit. Because pHEMT amplifiers are seriously affected by temperature variations, Noh discloses a three transistor active gate bias circuit. Using 3 resistors and 3 transistors, the bias circuit provides compensation of temperature variations. Increasing the drain current as the temperature increases compensates for temperature variations. Fine control over the multiple resistors and transistors affect the yield of the monolithic circuit. Many RC shunt networks are added to all gates of the amplifying stages. While the design is optimized to be monolithic, it appears to be overly complex and not cost effective.

It is difficult to accurately bias GaAs amplifier circuits for consistent performance since the same gate voltage can result in different bias currents due to large variations in Vg in production. Active feedback biasing technique is often employed which requires additional transistor and feedback mechanism. More consistent performance can be achieved by controlling the variations in the amplifier bias current using current mirroring technique. Current mirrors are known and taught for GaAs MOSFET circuits in U.S. Pat. No. 4,896,121 however no mention of temperature compensation is made.

For some applications, both a switch and at least one Low Noise Amplifier (LNA) are required. For example, a dual polarization antenna with dual ports would require two conventional monolithic LNAs and a switch to maintain the desired low noise figure. Implementing a switch for dual port selection and then a single low noise amplifier can result in degraded performance (increased noise figure) due to the switch loss. Having two LNAs and a switch increases the cost. A dual port system designer is challenged by the dilemma of a noisy single LNA solution or a costly two LNA solution.

Figure 1A:
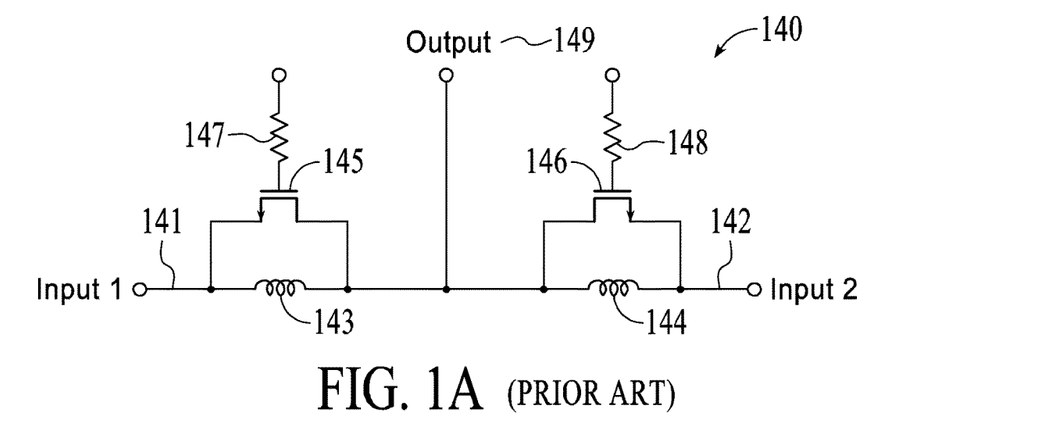
FIG. 1A is a conventional switch.
Figure 1B:
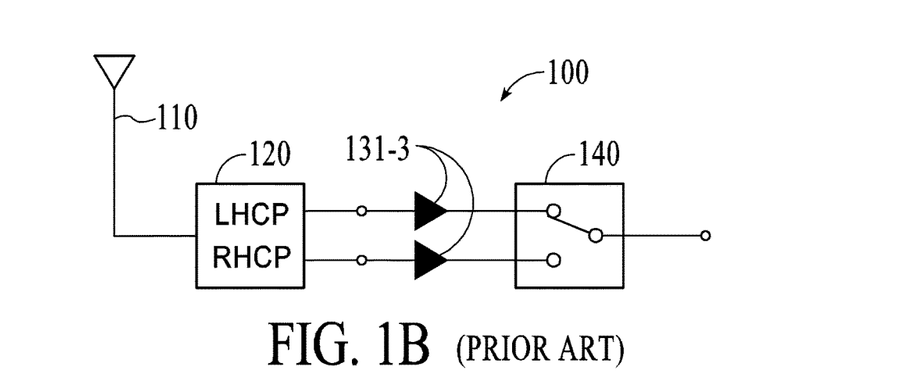
FIG. 1B shows the switch at the outputs of twin amplifiers.
Figure 1C:
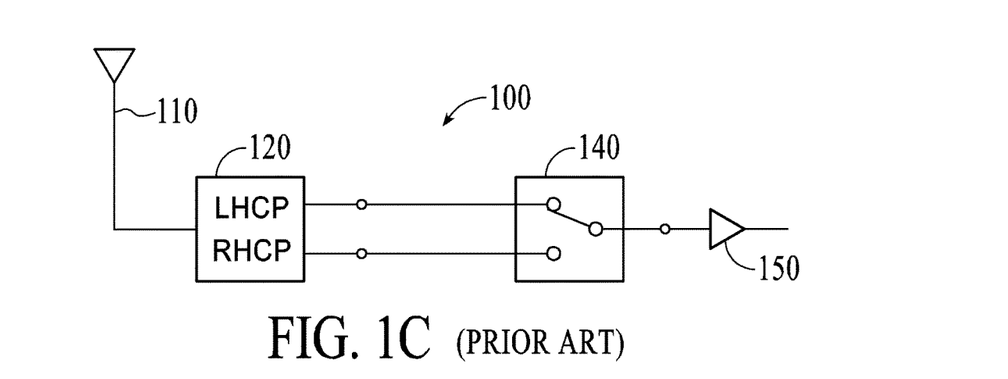
FIG. 1C shows the switch at the input of a single amplifier.

Referring now to the figures, prior art is shown in FIGS. 1A, 1B, and 1C. One conventional system would utilize a switch 140 such as illustrated in FIG. 1A which enables either Input 1 at 141 or Input 2 at 142 to propagate to the output 149. A combination of voltages applied to resistors 147 148 cause the transistors 145 146 to be variously open or closed. The inductors 143 144 provide RF impedance matching.

Referring to FIG. 1B an antenna 110 is coupled to a circuit 120 that provides two polarized signals LHCP and RHCP. Each signal passes through one of two low noise amplifiers (LNA) 131 or 133 and thence to a switch 140. This is a costly solution because maximum utilization of the amplifying resource can only be 50% and in a handheld implementation, battery is wastefully consumed by both LNAs.

An alternative solution FIG. 1C has the circuit 120 directly coupled to the switch 140 which is followed by a single LNA 150. While economical, this design suffers from additional loss introduced by switch 140 which degrades noise figure.

What is needed is a more economical design than FIG. 1B and a less noisy design than FIG. 1C. What is more generally needed is an improved circuit for biasing GaAs transistors; an improved GaAs switch for amplifiers; and an improved GaAs Low Noise Amplifier (LNA) for signal isolation.

BRIEF SUMMARY OF THE INVENTION

A mixed technology low noise receiver combines optimization of GaAs performance with CMOS economics.

Each portion may be fabricated from IP. A gate bias circuit for a plurality of GaAs amplifier stages is coupled to a temperature compensation current received from a CMOS control stage. Dual technology and a current mirror provides a more elegant gate bias solution.

A plurality of pHEMPT amplifier stages are coupled to the gate bias circuit and to a control voltage which directly operates on the voltage produced by the gate bias circuit. This technique switches amplifier stages more rapidly to enable multiplexing of an antenna. A pass transistor in a current mirror provides a no loss switch and also reduced cost. The penultimate pHEMPT amplifier stage is coupled to a CMOS amplifier stage.

A CMOS circuit provides both the temperature compensation current by a PTAT circuit and the control voltage enabling each pHEMPT transistor to receive its gate bias voltage. Simpler designs for each technology enable improved yields and quicker time to market.

Figure 2:
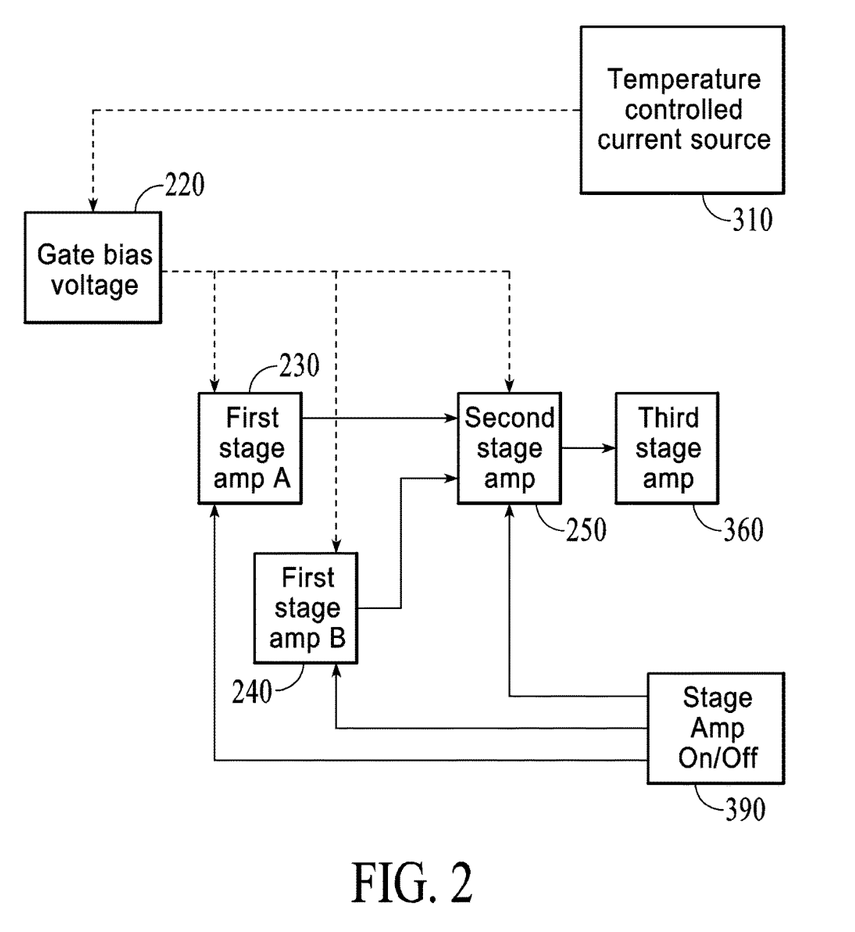
FIG. 2 shows a top-level signal and control flow block diagram of a presently disclosed multiplexed multi-stage low noise amplifier.

FIG. 2 illustrates a preferred embodiment of a multiplexing low noise amplifier. There are a plurality of first stage amplifiers in this illustration Amp A 230 and Amp B 240. Additionally there are two following stages 250 and 360. Where necessary a gate bias voltage is made available to the amplifiers by a circuit 220. An amplifier control voltage 390 externally provided, causes the gate bias voltage to be controllably effective or ineffective within certain stage amplifiers. In this illustration, the third stage amp 360 is of a technology indifferent to gate bias voltage but the amplifiers of the first and second stages require gate bias voltage to operate correctly within the range of temperatures. A temperature controlled current source 310 is provided to the gate bias voltage circuit to compensate for positive thermal feedback by adjusting gate bias voltage for the first and second stages. The amplifier control voltage enables or disables a current mirror effect between a stage amplifier and the gate bias voltage circuit.

Figure 3:
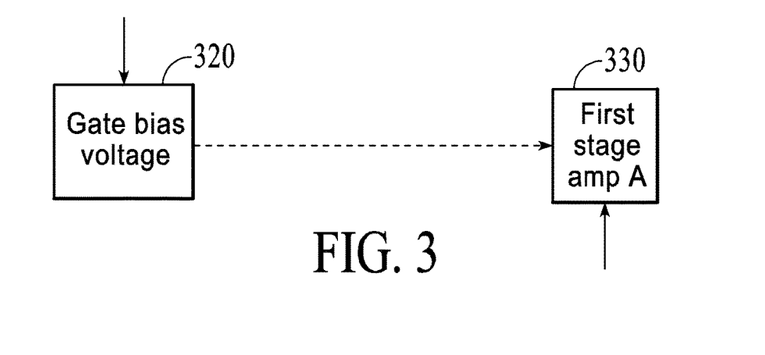
FIG. 3 shows a top-level block diagram of a current mirror design which is reused throughout this disclosure.

FIG. 3 illustrates the top-level simplest current mirror configuration for a single amplifier stage 330. A circuit 320 receives a temperature compensation current which determines a gate bias voltage that is controllably mirrored within at least one amplifier 330. The amplifier 330 also receives a control voltage to enable or disable application of the gate bias voltage. For design reuse purposes, it is simpler to replicate a stage amplifier which each contains a circuit to control availability of the gate bias voltage to a current mirror.

Figure 4:
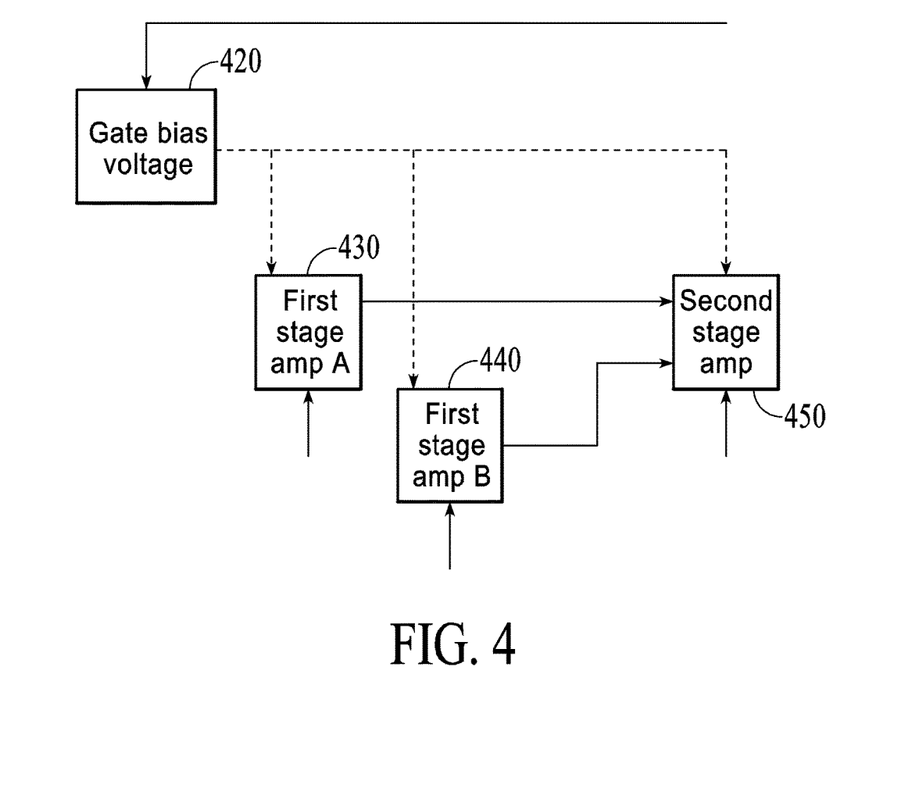
FIG. 4 is a top-level block diagram of a two stage switched amplifier.

FIG. 4 illustrates the top-level control and signal flow in multiplexing two signals through a dual stage amplifier. A circuit 420 receives a temperature compensation current which determines a common gate bias voltage that is controllably mirrored within a plurality of stage amplifiers 430 440 450. For visual clarity, each amplifier stage is shown to receive its unique control voltage input to enable or disable the common gate bias voltage input. Each amplifier conceptually contains an amplifying component and a separate switching component. When a biasing gate voltage is removed from the input signal, the amplifying component is non-operative and signal propagation is blocked. Thus, economically, ⅔ of the available amplifying resource is utilized and only ⅓ idle during operation, a savings in area and power. The inventive principle is extensible to multiplexing among more than two input signals by replicating first stage amplifiers in parallel, each receiving the common gate bias voltage and its individual control voltage.

Figure 5:
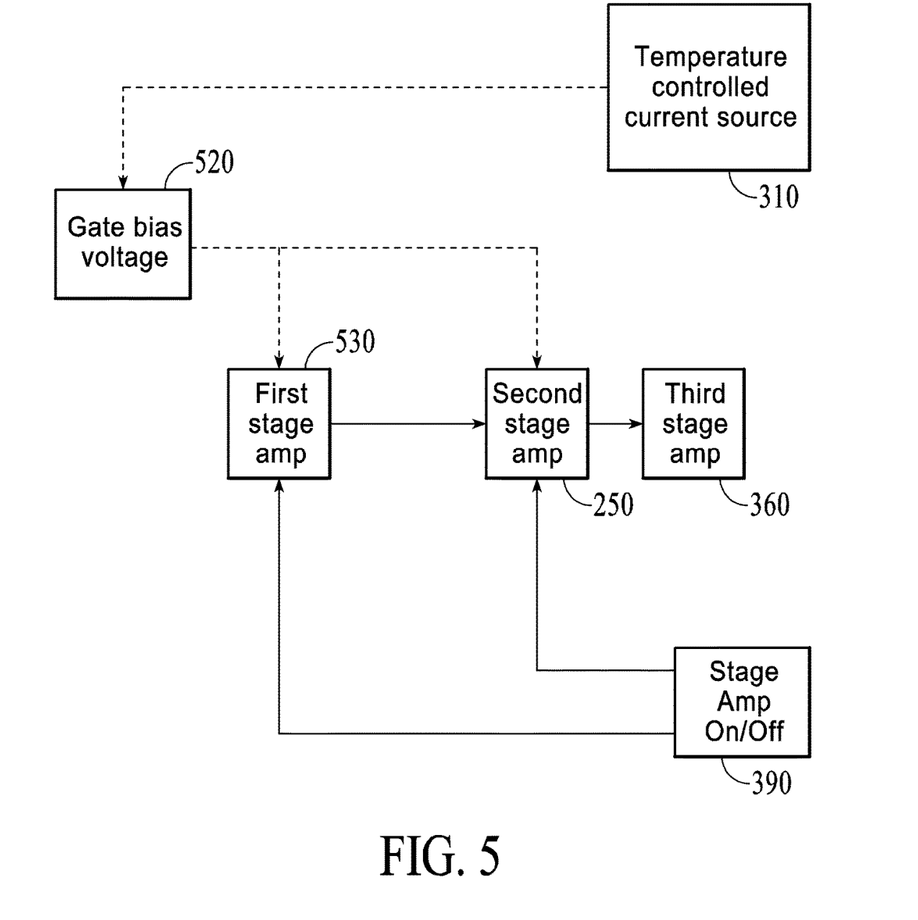
FIG. 5 is a top-level block diagram of a three stage mixed technology amplifier.

FIG. 5 illustrates the top-level control and signal flow through a mixed technology preferred embodiment of a multi-stage amplifier. A third stage amp in a technology such as CMOS is coupled to the second stage amp 250. The third stage amp can have its own self-contained temperature compensation within its own technology (not shown). A circuit to determine and supply amplifier control voltages 390 is coupled to the amplifier stages 530 and 250. A temperature controlled current source 310 is coupled to a circuit to determine a temperature compensation gate bias voltage. The signal amplified by the first stage amplifier is coupled to the second stage amplifier 250. The signal amplified by the second stage amplifier is coupled to the third stage amplifier 360. The amplifier control voltage circuit 390 moderates when a signal may pass through first and second stage amplifiers 530 250.

BRIEF DESCRIPTION OF THE SEVERAL VIEWS OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1A, 1B, and 1C show prior switched amplifier prior art.

DETAILED DISCLOSURE OF EMBODIMENTS OF THE INVENTION

Amplifiers which are fabricated with GaAs technology require gate biasing to achieve desired characteristics. An implementation of a current mirror allows switching of each amplifier stage. Each pHEMPT amplifier stage includes a pass transistor through which a gate bias voltage is channeled from drain to source. The gate of the pass transistor is controlled by an external control voltage.

The switchable mirror effect occurs between the gate of the bias transistor and the gate of each amplifier transistor when the gate of the pass transistor enables current flow through a gate bias resistor. The gate of each pass transistor depends on current flowing through a resistor driven by a control voltage. The gate of the pass transistor also is coupled to ground through a capacitor, coupled to an ESD2 one of two elaborated electrostatic discharge diode cascades, and is coupled by a diode network to its own source. In an example the control voltage is changed from −3 volts to approximately zero volts. When the control voltage is 0 volts, the voltage at the gate of the bias circuit passes through and the amplifier is on. When the control voltage is −3 volts, the voltage at the gate of the bias circuit is blocked and the amplifier gates are driven to −2 volts and the amplifier is off.

The gate of the bias circuit is also coupled by a third resistor to all of an external current sink, ground through a capacitor, and another instance of ESD2.

In a preferred embodiment, a pull down resistor coupled to a constant negative voltage provides an external current sink to the bias gate. This maintains a gate bias voltage value always in a negative region at the drain of the pass transistor.

The source terminal of the voltage gate bias transistor (biassource) is always coupled to ground as is the source terminal of each of the amplifier transistors. The drain terminal of the voltage gate bias transistor (biasdrain) is coupled to an external current source, to ground through a capacitor, to a first instance of ESD1 another elaborated electrostatic discharge diode cascade, and to its own gate terminal (biasgate) through a diode circuit made up of a plurality of diodes.

Each amplifier transistor is coupled at its drain terminal (ampdrain) to Vcc through an output impedance matching network(Zout). Each amplifier transistor is coupled at its gate terminal (ampgate) to an input impedance matching network (Zin) and to the first gate bias resistor coupled to the source of the pass transistor. Using the novel switched current mirror (when the pass transistor allows) provides a gate bias voltage which responds to the external current source which is a temperature compensation current source.

This gate biasing circuit may be usefully employed in a multiplexing amplifier as follows. The multiplexing amplifier has a root pHEMPT stage amplifier (rootamp) enabled or disabled by a root switchable external control voltage connector. Feeding the rootamp is a plurality of parallel branch pHEMPT stage amplifiers (branchamp), each receiving a branch-specific input signal and each enabled or disabled by a branch-specific switchable external control voltage connector.

More specifically, one implementation uses a first and a second parallel branch pHEMPT stage amplifer; each one having a branch-specific switchable external control voltage connector controlled by external control voltage to form a single-pole-double-throw switch. Accordingly, the multiplexing amplifier emits one of the group of an amplified 1st signal, and an amplified second signal. An "off" control voltage of the rootamp trumps any combination of voltages on the branchamps of course.

As implied earlier, the multiplexing amplifier utilizes a voltage gate bias circuit, coupled to an external temperature compensation current source at its drain terminal. The voltage gate bias circuit is coupled at its gate terminal to each pHEMPT stage amplifier to provide a gate bias voltage, but not necessarily to the amplifer transistor.

Each stage amplifier has a pHEMPT amplifying transistor coupled at its drain to Vcc and to an output impedance matching circuit(Zout); and a pass transistor controlled by its passgate according to a switchable external control voltage. The pass transistor is coupled at its drain to the gate terminal of the current mirror circuit (biasgate) to receive a gate bias voltage and is coupled at its source to a gate terminal of the pHEMPT amplifying transistor (ampgate) through an input impedance matching circuit (Zin). So the current mirror effect on gate bias voltage may be enabled or disabled by the control voltage applied to the gate of the pass transistor.

An input impedance matching circuit of each parallel branchamp is further coupled to a branch-specific signal source. The input impedance matching circuit of the rootamp is coupled to all of the output impedance matching circuits of the plurality of branchamps. Applying the specific external control voltage values of each branchamp and the rootamp in combinations enables emission of at most only one amplified signal source of the plurality of signal sources. Or, in another combination, no signal at all when the control voltage value shuts down the rootamp.

Another use of the current mirroring gate bias circuit is a mixed technology Low Noise Amplifier (LNA). This is made by combining an external bias control; coupled to, a pHEMPT gate voltage bias circuit, which mirrors its gate voltage to, a multi-stage pHEMPT amplifier (GaAs) module. This is more economical and easier to manufacture because the external bias control is a CMOS circuit. Well understood diode behavior in CMOS provides the external bias control as a temperature compensation current source. Higher performance and lower cost is achieved by adding a final CMOS stage amplifier.

An example of an application is a three-way switchable low noise amplifier using the combination of a first parallel pHEMPT stage amplifier coupled in series to a first signal source, and to a first switchable control voltage connector; a second parallel pHEMPT stage amplifier coupled in series to a second signal source, and to a second switchable control voltage connector; and a penultimate pHEMPT stage amplifier coupled to a plurality of parallel pHEMPT stage amplifiers, and to a penultimate switchable control voltage connector. Using a single-pole-double-throw switch coupled to the first and second switchable control voltage connectors, the circuit emits one of the group an amplified first signal, and an amplified second signal (when the penultimate switchable control voltage enables emission). Saving some cost, each switchable control voltage connector is coupled to a CMOS logic circuit.

Another configuration of an amplifier has a GaAs module made of the following: a plurality of pHEMPT stage amplifiers in series; each stage amplifier coupled to, at least one switchable control voltage connector; and each stage amplifier further coupled to the gate voltage bias circuit controlled by a temperature compensation current source.

As before the amplifier uses a CMOS module which contains a temperature compensation current circuit; a switchable control voltage circuit; and a final amplifier stage coupled to the penultimate stage of a plurality of pHEMPT stage amplifiers. Setting the switchable control voltage circuit enables propagation of at most one signal source through the stages. The gate voltage bias circuit receives a proportional to absolute temperature (PTAT) compensation current circuit.

Here the gate voltage bias circuit includes a transistor having a gate terminal (biasgate), a drain terminal (biasdrain), and a source terminal (biassource). The transistor is coupled at its gate to a gate terminal of an amplifier transistor (ampgate) through at least one pass transistor of at least one stage amplifier and through an input impedance matching network. Thus a current mirror selectably provides a gate bias voltage value to each stage amplifier.

The biasgate is also coupled through a diode circuit to a temperature compensation current source and to its biasdrain. The biasgate is also coupled through a resistor to negative voltage. The gate voltage bias circuit is also coupled to ground at its biassource.

Each pHEMPT stage amplifier is made up of a pHEMPT amplifier transistor which is coupled to ground at its source and coupled to an output impedance matching network (Zout) at its drain. The gate is where the input signal and gate bias voltage are combined. A pass transistor is coupled at its source to the ampgate by an input impedance matching network (Zin) and coupled at its passdrain to a gate terminal of the gate voltage bias circuit (biasgate). The input impedance matching network (Zin) of the stage amplifier is also coupled to an amplifier input connector (AmpIn). At its gate, the pass transistor is also coupled a control voltage connector and through a diode circuit to its own source. The output impedance matching network Zout is also connected to Vcc and to an amplifier output connector (AmpOut).

Figure 6:
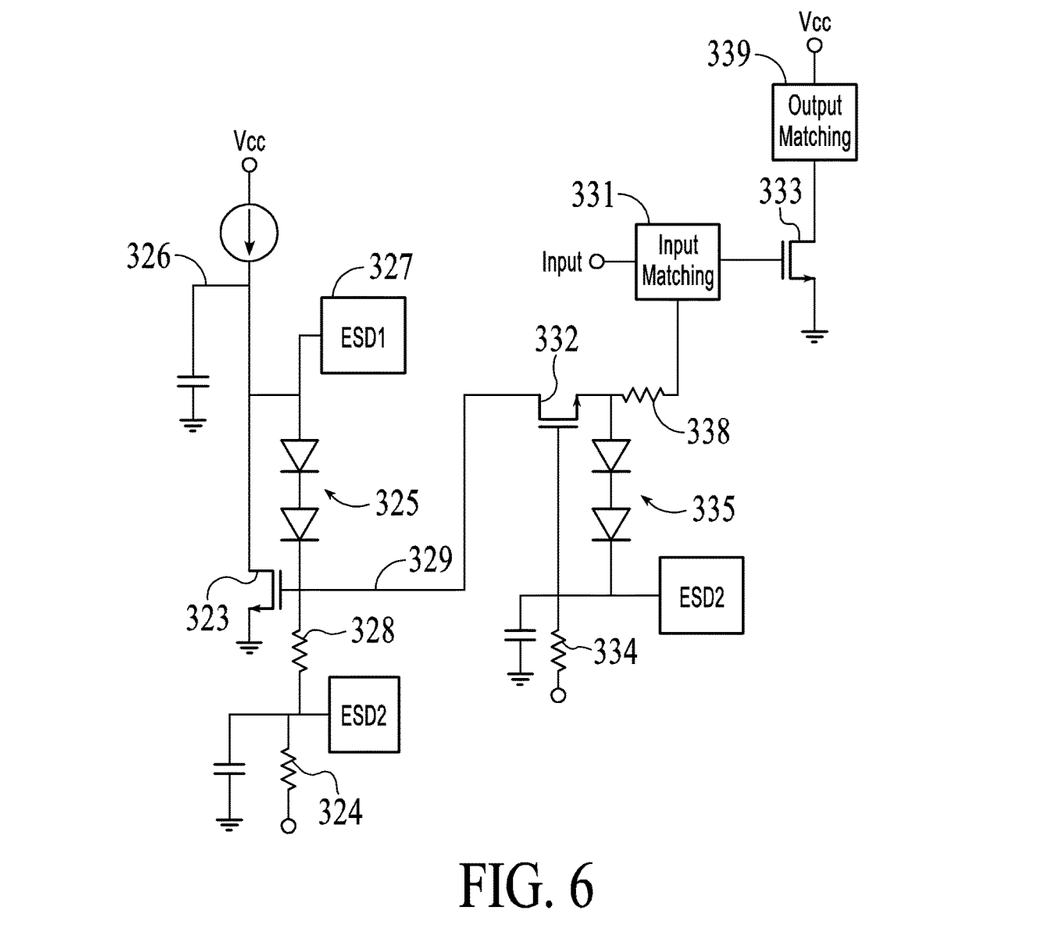
FIG. 6 is a circuit schematic diagram of a pass transistor connecting the elements of a current mirror.

Referring now to FIG. 6, this schematic illustrates the details of a simplest current mirror configuration for a single amplifier stage 330.

The amplifier output is coupled an Output Impedance Matching Network (Zout) 339. This Zout is coupled to Vcc and also to a drain terminal of a GaAs amplifying transistor 333. The gate terminal of amplifying transistor 333 is coupled to its Input Impedance Matching Network (Zin) 331. This Zin is coupled to a signal input (Input). That describes the signal path through a single stage amplifier.

A gate bias voltage 329 is controllably provided to the GaAs stage amplifier Input Matching Impedance Network 331 through a pass transistor 332 and a resistor 338 coupled to the source terminal of the pass transistor. The gate bias voltage is provided by the gate terminal of bias voltage transistor 323 which forms a current mirror circuit with the gate terminal of GaAs amplifying transistor 333 when enabled by a voltage on the gate terminal of the pass transistor 332.

An externally provided temperature compensation circuit delivers an external current source coupled to a bias gate voltage circuit of the GaAs module. This so-called temperature compensation current is coupled firstly to a first electrostatic discharge diode cascade 327, secondly to a bypass capacitor 326, thirdly to a drain terminal of transistor 323, and fourthly, through a diode network 325 to a gate terminal of transistor 323. The gate terminal of transistor 323 is further connected to a first terminal of resistor 328. Resistor 328, at its second terminal, is coupled firstly to a second electrostatic discharge diode cascade, secondly to a bypass capacitor as needed, and thirdly to resistor 324 at its first terminal. Resistor 324 is coupled at its second terminal to a constant negative DC voltage source whereby the gate bias voltage is always within a negative range of values.

A control voltage is coupled as follows to the GaAs single stage amplifier. The gate terminal of pass transistor 332 is coupled a first terminal of a resistor 334. The second terminal of this resistor is coupled to an externally provided control voltage. Additionally, the gate terminal of pass transistor 332 is coupled firstly to a second electrostatic discharge diode cascade, secondly to a bypass capacitor as needed, and thirdly through a diode network 335 to its source terminal.

The source terminal of each of the GaAs amplifying transistor 333 and the gate bias transistor 323 is connected to ground.

Proliferation of bypass capacitors and electrostatic discharge diode cascades are known best practices and illustrative placement is shown only for enablement.

Thus, a temperature compensation current determines a gate bias voltage that can be mirrored within at least one amplifier. The amplifier also receives a control voltage to enable or disable the gate bias voltage. The inventive principle disclosed is switching of a gate bias voltage within a current mirror circuit. The AC component of the Input signal is not switched. Rather a shift in DC bias translates the Input signal into and out of an active region of operation.

Figure 7:
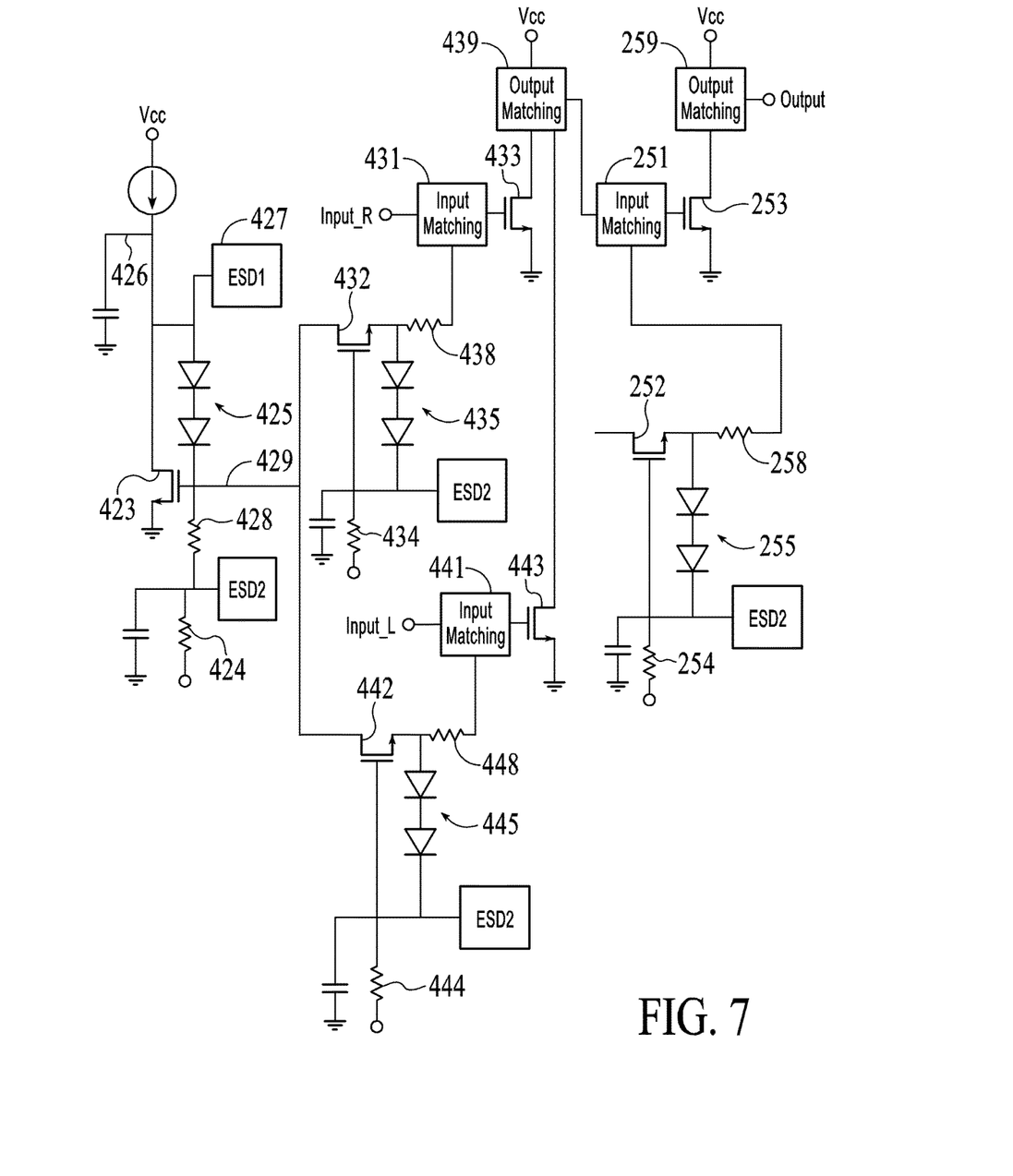
FIG. 7 is a circuit schematic diagram of a twin input switched amplifier utilizing a current mirror.

Referring now to FIG. 7 a circuit schematic of a multiplexing multi-stage Low Noise Amplifier (LNA) is disclosed. The amplifier output is coupled to a penultimate Output Impedance Matching Network (pZout) 259. This pZout is coupled to a drain terminal of a penultimate amplifying transistor 253 and also to Vcc. The gate terminal of penultimate amplifying transistor 253 is coupled to its penultimate Input Impedance Matching Network (pZin) 251. This pZin is coupled to an initial Output Impedance Matching Network (iZout) 439. This iZout is coupled to Vcc and also to both a drain terminal of a first initial amplifying transistor 433 and also to a drain terminal of a second initial amplifying transistor 443. The gate terminal of initial amplifying transistor 433 is coupled to its initial Input Impedance Matching Network (iZinA) 431. This iZinA is coupled to a signal input, Input_R. The gate terminal of initial amplifying transistor 443 is coupled to its initial Input Impedance Matching Network (iZinB) 441. This iZinB is coupled to a signal input, Input_L.

That describes the switchable signal paths. Additional stage amplifiers may be attached in parallel with the initial stage amplifiers disclosed above without changing the principle of operation. Thus, a plurality of Inputs is multiplexed using the present inventive principle.

A gate bias voltage 429 is controllably provided to each GaAs stage amplifier Input Matching Impedance Network 431 441 251 through a pass transistor 432 442 252 and a resistor 438 448 258 coupled to the source terminal of the pass transistor. The gate bias voltage is provided by the gate terminal of bias voltage transistor 423 which forms a current mirror circuit with the gate terminal of each GaAs stage amplifying transistor 433 443 253 when enabled by a voltage on the gate terminal of the pass transistors 432 442 252.

An externally provided temperature compensation circuit delivers an external current source coupled to a bias gate voltage circuit of the GaAs module. This so-called temperature compensation current is coupled firstly to a first electrostatic discharge diode cascade 427, secondly to a bypass capacitor 426, thirdly to a drain terminal of transistor 423, and fourthly, through a diode network 425 to a gate terminal of transistor 423. The gate terminal of transistor 423 is further connected to a first terminal of resistor 428. Resistor 428, at its second terminal, is coupled firstly to a second electrostatic discharge diode cascade, secondly to a bypass capacitor as needed, and thirdly to resistor 424 at its first terminal. Resistor 424 is coupled at its second terminal to a constant negative DC voltage source whereby the gate bias voltage is always within a negative range of values.

At least one control voltage is coupled as follows to the plurality of GaAs stage amplifiers. Each gate terminal of stage amplifier pass transistors 432 442 252 is coupled to a first terminal of a resistor 434 444 254. The second terminal of these resistors is coupled to an externally provided control voltage. Additionally, each gate terminal of pass transistors 432 442 252 is coupled firstly to a second electrostatic discharge diode cascade, secondly to a bypass capacitor as needed, and thirdly through a diode network 435 445 255 to its source terminal.

The source terminal of each of the GaAs amplifying transistors 433 443 253 and the gate bias transistor 423 is connected to ground.

Proliferation of bypass capacitors and electrostatic discharge diode cascades are known best practices and illustrative placement is shown only for enablement.

Figure 8:
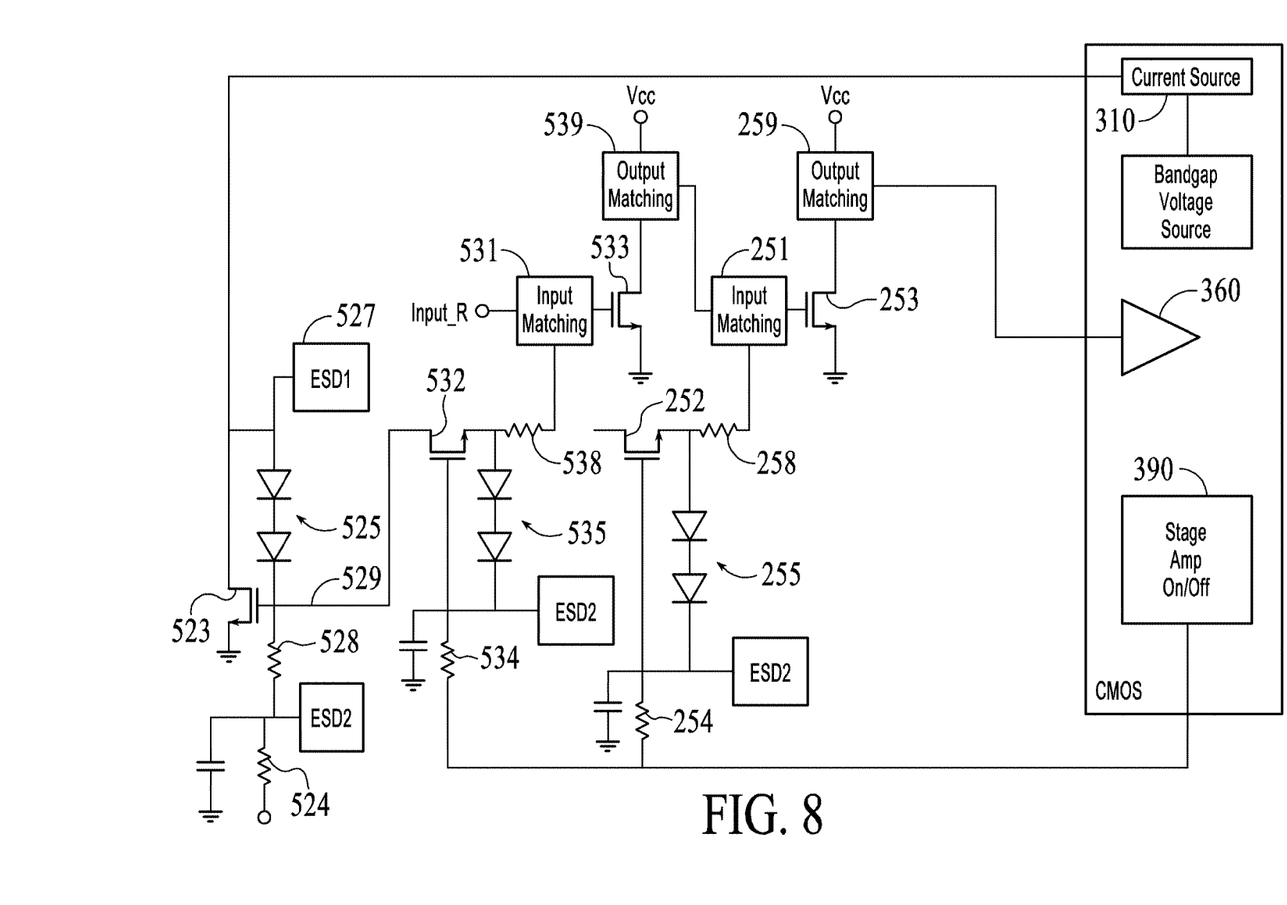
FIG. 8 is a circuit schematic diagram of a mixed technology three stage amplifier utilizing a current mirror on gate bias voltage to switch the amplifier.

Referring now to FIG. 8 a circuit schematic of a mixed technology multi-stage Low Noise Amplifier (LNA) is disclosed. A CMOS module is coupled to a GaAs PHEMPT module by a signal lead, a current lead, and at least one voltage lead. The CMOS module includes a final stage CMOS LNA 360 which is coupled to the signal output of the penultimate stage amplifier of the GaAs module by its penultimate Output Impedance Matching Network (pZout) 259. This pZout is coupled to a drain terminal of a penultimate amplifying transistor 253 and also to Vcc. The gate terminal of penultimate amplifying transistor 253 is coupled to its penultimate Input Impedance Matching Network (pZin) 251. This pZin is coupled to an initial Output Impedance Matching Network (iZout) 539 of an initial amplifying transistor. This iZout is coupled to a drain terminal of an initial amplifying transistor 533 and also to Vcc. The gate terminal of initial amplifying transistor 533 is coupled to its initial Input Impedance Matching Network (iZin) 531. This iZin is coupled to a signal input, Input_R. That describes the entire signal path. Additional stage amplifiers may be interposed between the initial and the penultimate without changing the principle of operation.

A gate bias voltage 529 is controllably provided to each GaAs stage amplifier Input Matching Impedance Network 531 251 through a pass transistor 532 252 and a resistor 538 258 coupled to the source terminal of the pass transistor. The gate bias voltage is provided by the gate terminal of bias voltage transistor 523 which forms a current mirror circuit with the gate terminal of each GaAs stage amplifying transistor 533 253 when enabled by a voltage on the gate terminal of the pass transistors 532 252.

The CMOS module also has a temperature compensation circuit 310 which provides an external current source coupled to a bias gate voltage circuit of the GaAs module.

This so-called temperature compensation current is coupled firstly to a first electrostatic discharge diode cascade, secondly to a bypass capacitor as needed, thirdly to a drain terminal of transistor 523, and fourthly, through a diode network 525 to a gate terminal of transistor 523. The gate terminal of transistor 523 is further connected to a first terminal of resistor 528. Resistor 528, at its second terminal, is coupled firstly to a second electrostatic discharge diode cascade, secondly to a bypass capacitor as needed, and thirdly to resistor 524 at its first terminal. Resistor 524 is coupled at its second terminal to a constant negative DC voltage source whereby the gate bias voltage is always within a negative range of values.

The CMOS module also has at least one control voltage circuit 390 which is coupled as follows to the plurality of GaAs stage amplifiers. Each gate terminal of stage amplifier pass transistors 532 252 is coupled a first terminal of a resistor 534 254. The second terminal of these resistors is coupled to the control voltage received from the CMOS module. Additionally, each gate terminal of pass transistors 532 252 is coupled firstly to a second electrostatic discharge diode cascade, secondly to a bypass capacitor as needed, and, thirdly through a diode network 535 255 to its source terminal.

The source termini of the GaAs amplifying transistors 533 253 and the gate bias transistor 523 is connected to ground.

Figure 9:
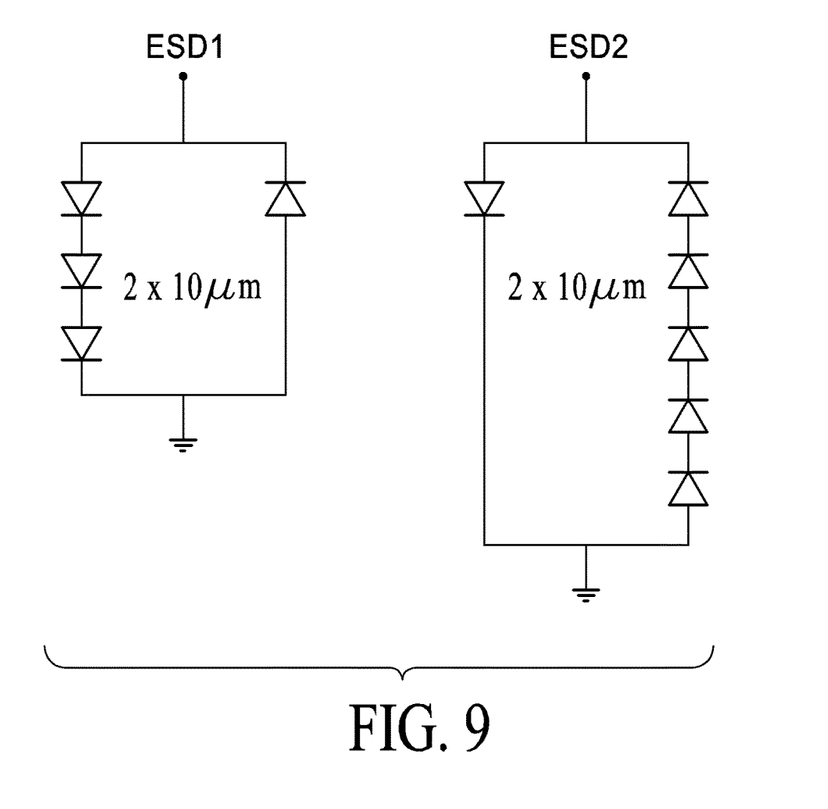
FIG. 9 is a schematic of two non-conventional diode cascades for enablement of non-standard electrostatic discharge protection as a further limitation of the disclosed circuit schematics.

Proliferation of bypass capacitors and electrostatic discharge diode cascades are known best practices and illustrative placement is shown only for enablement. A preferred embodiment of electrostatic discharge diode cascades is shown in FIG. 9 as a proof of enablement.

Conclusion

The invention is easily distinguished from conventional GaAs amplifiers by its current mirror based bias voltage, mixed technology, and switchable bias voltage for each stage. Each amplifier stage contains a pass transistor which is not in the signal path. The pass transistor allows or denies a gate bias voltage, which when combined with signal input provides a current mirror effect. Each stage amplifier is inoperable without the current mirror effect. In an embodiment, a CMOS module provides a low cost final stage amplifier. In an embodiment, a CMOS module provides a temperature compensation current which determines a gate bias voltage for all GaAs stage amplifiers. In an embodiment, a CMOS module provides a selectable voltage to a pass transistor, which selection provides a conditional current mirror effect.

One aspect of the invention is a switched current mirror in a pHEMPT amplifier which includes at least one pass transistor having a gate terminal (passgate), a drain terminal, (passdrain), and a source terminal (passsource); at least one amplifier transistor having a gate terminal (ampgate), a drain terminal, (ampdrain), and a source terminal (ampsource); and a voltage gate bias transistor having a gate terminal (biasgate), a drain terminal, (biasdrain), and a source terminal (biassource), wherein the at least one pass transistor is coupled at its passsource to an ampgate through at least one first gate bias resistor and is further coupled at its passdrain to the biasgate; wherein a passgate of the pass transistor is coupled to all of firstly, ground through a capacitor, secondly, an ESD2, thirdly its own passsource through a diode circuit, and fourthly, a switchable external control voltage connector through a second control voltage resistor; and wherein the biasgate is further coupled by a third resistor to all of firstly, an external current sink, secondly, ground through a capacitor, and thirdly another instance of ESD2.

In an embodiment the external current sink is a pull down resistor coupled to a constant negative voltage, whereby a gate bias voltage value is kept in a negative region.

In an embodiment of the current mirror, a source terminal of the voltage gate bias transistor (biassource) is coupled to ground; the drain terminal of the voltage gate bias transistor (biasdrain) is coupled to firstly an external current source, secondly ground through a capacitor, thirdly a first instance of ESD1, and fourthly its own gate terminal (biasgate) through a diode circuit.

In an embodiment of the switch current mirror, the at least one amplifier transistor is coupled at its drain terminal (ampdrain) to Vcc through an output impedance matching network (Zout); and is further coupled at its source terminal (ampsource) to ground; and is further coupled at its gate terminal (ampgate) to an input impedance matching network (Zin) and to the first gate bias resistor.

In an embodiment of the switched current mirror the external current source is a temperature compensation current source.

Another aspect of the invention is a multiplexing amplifier which includes a root pHEMPT stage amplifier (rootamp) having an input terminal and an output terminal, the rootamp also coupled to a root switchable external control voltage connector; a plurality of parallel branch pHEMPT stage amplifiers (branchamp), each coupled at an input terminal to a branch-specific signal source and each coupled to a branch-specific switchable external control voltage connector; and said rootamp input terminal coupled to all output termini of the said plurality of branchamps.

In an embodiment of the multiplexing amplifier, the plurality of branchamps includes a first and a second parallel branch pHEMPT stage amplifer; and the first and second branch-specific switchable external control voltage connectors are controlled by external control voltage to form a single-pole-double-throw switch, whereby the multiplexing amplifier emits one of the group of an amplified 1st signal, and an amplified second signal.

In an embodiment of the multiplexing amplifier it also includes a current mirror circuit, said current mirror circuit coupled to an external temperature compensation current source at its drain terminal and said current mirror circuit further coupled at its gate terminal to each pHEMPT stage amplifier to provide a gate bias voltage.

In an embodiment of the multiplexing amplifier, each stage amplifier includes a pHEMPT amplifying transistor having a gate terminal (ampgate), a drain terminal (ampdrain), and a source terminal (ampsource); the amplifying transistor coupled at its draingate to Vcc and to an output impedance matching circuit (Zout); and a pass transistor having a gate terminal (passgate), a drain terminal (passdrain), and a source terminal (passsource); the pass transistor controlled by its passgate according to a switchable external control voltage, the pass transistor coupled at its passdrain to the gate terminal of the current mirror circuit (biasgate) to receive a gate bias voltage and coupled at its passsource to a gate terminal of the pHEMPT amplifying transistor (ampgate) through an input impedance matching circuit (Zin).

In an embodiment, the input impedance matching circuit of each parallel branchamp is further coupled to a branch-specific signal source; the input impedance matching circuit of the rootamp is coupled to all of the output impedance matching circuits of the plurality of branchamps; and the specific external control voltage values of each branchamp and the rootamp in combinations enable emission of at most only one amplified signal source of the plurality of signal sources and in another combination, no signal at all.

Another commercially interesting aspect of the invention is a mixed technology Low Noise Amplifier (LNA), which includes an external bias control; coupled to, a pHEMPT gate voltage bias circuit, which mirrors its gate voltage to a multi-stage pHEMPT amplifier (GaAs) module. Economically, the external bias control is a CMOS circuit. Advantageously, the external bias control is a temperature compensation current source. Taking advantage of the inherent material costs, the amplifier includes a final CMOS stage amplifier.

In one embodiment, the GaAs module includes a first parallel pHEMPT stage amplifier coupled in series to a first signal source, and to a first switchable control voltage connector; a second parallel pHEMPT stage amplifier coupled in series to a second signal source, and to a second switchable control voltage connector; a penultimate pHEMPT stage amplifier coupled to a plurality of parallel pHEMPT stage amplifiers, and to a penultimate switchable control voltage connector; and a single-pole-double-throw switch coupled to the first and second switchable control voltage connectors, whereby the circuit emits one of the group an amplified first signal, and an amplified second signal when the penultimate switchable control voltage enables emission. In an embodiment, each switchable control voltage connector is coupled to a CMOS logic circuit.

In an embodiment, the GaAs module includes a plurality of pHEMPT stage amplifiers in series; each stage amplifier coupled to, at least one switchable control voltage connector; and each stage amplifier further coupled to the pHEMPT gate voltage bias circuit controlled by a temperature compensation current source.

In an embodiment, the amplifier includes a CMOS module, which features a temperature compensation current circuit; a switchable control voltage circuit; and a final amplifier stage coupled to the penultimate stage of a plurality of pHEMPT stage amplifiers, wherein the switchable control voltage circuit enables propagation of at most one signal source through the stages, and wherein a proportional to absolute temperature (PTAT) compensation current circuit is coupled to the pHEMPT gate voltage bias circuit.

In an embodiment, the pHEMPT gate voltage bias circuit includes a pHEMPT transistor having a gate terminal (biasgate), a drain terminal (biasdrain), and a source terminal (biassource); the pHEMPT transistor coupled at its biasgate to a gate terminal of an amplifier transistor (ampgate) through at least one pass transistor of at least one stage amplifier and through an input impedance matching network, whereby a current mirror provides a gate bias voltage value to each stage amplifier; the biasgate further coupled through a diode circuit to a temperature compensation current source and to its biasdrain; the biasgate further coupled through a resistor to negative voltage; and the gate voltage bias circuit further coupled to ground at its biassource.

In an embodiment, each pHEMPT stage amplifier includes a pHEMPT amplifier transistor having a gate terminal (ampgate), a drain terminal (ampdrain), and a source terminal (ampsource); the pHEMPT amplifier transistor coupled to ground at its ampsource and coupled to an output impedance matching network (Zout) at its ampdrain; a pass transistor having a gate terminal (passgate), a drain terminal (passdrain), and a source terminal (passsource); the pass transistor coupled at its passsource to the ampgate by an input impedance matching network (Zin) and coupled at its passdrain to a gate terminal of the gate voltage bias circuit (biasgate); said input impedance matching network (Zin) of the stage amplifier further coupled to an amplifier input connector (Ampin); the pass transistor further coupled at its passgate to a control voltage connector and through a diode circuit to its passsource; and the output impedance matching network Zout further coupled to Vcc and to an amplifier output connector (AmpOut).

Figure 10:
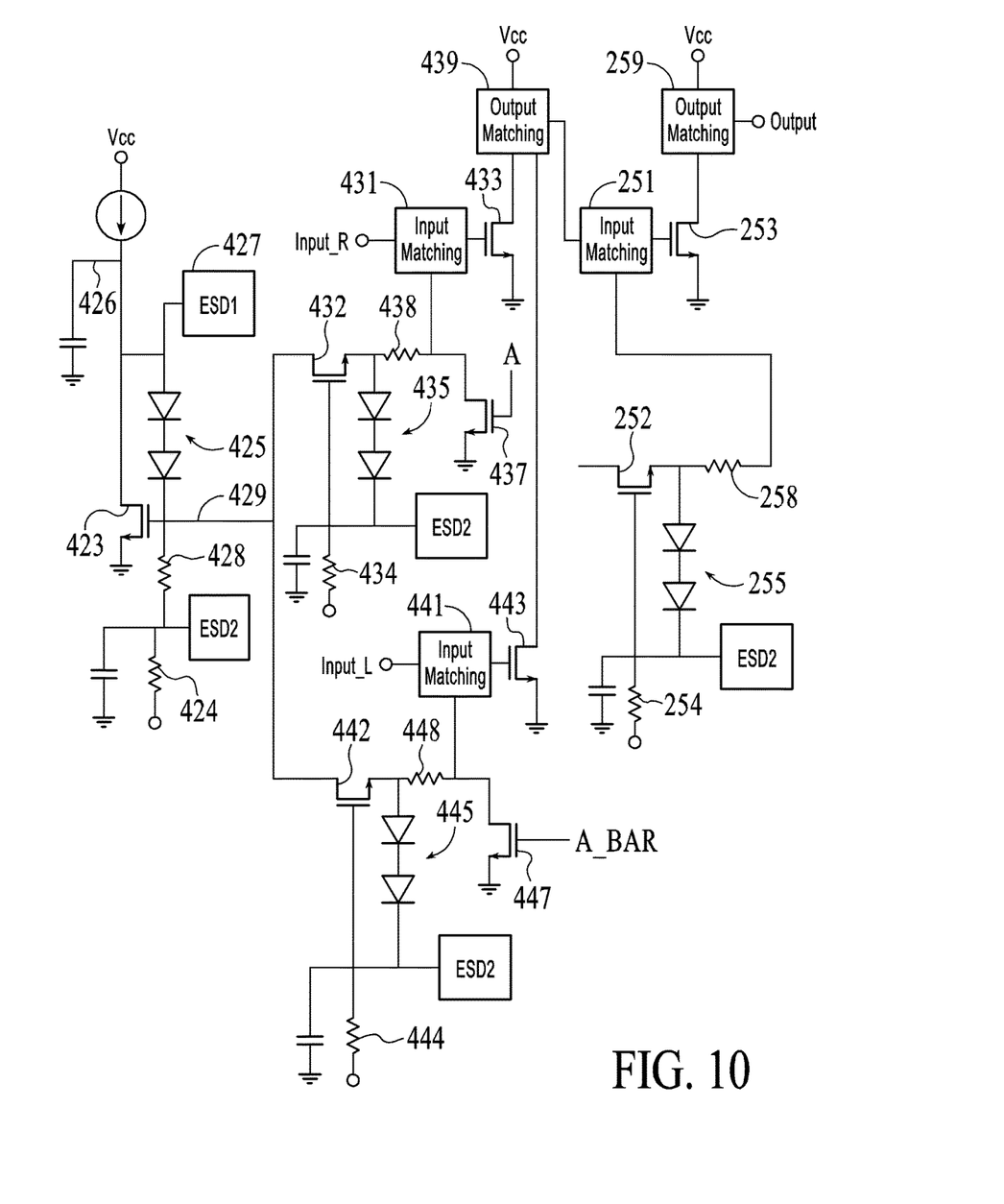
FIG. 10 is a circuit schematic of a low noise switched amplifier.

The invention is further distinguished from conventional circuits by a distributed LNA signal isolation switch. As shown in FIG. 10, a plurality of shunt transistors 437 447 shunt all but one LNA to ground. An inverter or a de-multiplexor selects which LNA is operating. The advantage of adding the extra switch is that when one LNA is shut down, at least one shunt switch (to ground) is closed. This improves signal isolation by 10 dB. The shunt transistors are controlled by control A and A_BAR to short the input when LNA is off. When LNA is on, the switch is open.

Without the LNA isolation switch, the difference between signal level via on-LNA and off-LNA is 16 dB. With this additional switch, the difference between signal level via on-LNA and off-LNA is 26 dB.

In a preferred embodiment, a mixed technology Low Noise Amplifier (LNA), includes a CMOS external bias control; coupled to, a gate voltage bias circuit, which mirrors its gate voltage to, a multi-stage pHEMPT amplifier module; a switched current mirror coupled to the pHEMPT amplifier module; a distributed LNA signal isolation switch; and a final CMOS stage amplifier which is coupled to the signal output of the penultimate stage amplifier of the pHEMPT amplifier module by its penultimate Output Impedance Matching Network. In an embodiment, the external bias control is a temperature compensation current source. In an embodiment, the distributed LNA signal isolation switch is a plurality of shunt transistors coupled to ground. In an embodiment, the shunt transistors are controlled by one of control A and A_BAR signal values whereby at least one LNA is off. In an embodiment, the shunt transistors couple to ground a gate bias voltage controllably provided to each GaAs stage amplifier Input Matching Impedance Network. In an embodiment, the shunt transistors couple to ground a gate bias voltage at a resistor coupled to each GaAs stage amplifier Input Matching Impedance Network. In an embodiment, at least one input matching impedance network of at least one GaAs stage amplifier is coupled to ground by a control signal A_BAR coupled to a shunt transistor.

A number of embodiments of the invention have been described. Nevertheless, it will be understood that various modifications may be made without departing from the spirit and scope of the invention. Accordingly, other embodiments are within the scope of the following claims.

The invention claimed is:

1. A mixed technology Low Noise Amplifier (LNA), the LNA comprised of:
   an external bias control; coupled to,
   a gate voltage bias circuit, which mirrors its gate voltage to,
   a multi-stage pHEMPT amplifier (GaAs) module;
   a final CMOS stage amplifier;
   a first parallel pHEMPT stage amplifier coupled in series to a first signal source, and to a first switchable control voltage connector;
   a second parallel pHEMPT stage amplifier coupled in series to a second signal source, and to a second switchable control voltage connector;
   a penultimate pHEMPT stage amplifier coupled to a plurality of parallel pHEMPT stage amplifiers, and to a penultimate switchable control voltage connector; and
   a single-pole-double-throw switch coupled to the first and second switchable control voltage connectors, whereby the circuit emits one of the group an amplified first signal, and an amplified second signal when the penultimate switchable control voltage enables emission.

2. A mixed technology Low Noise Amplifier (LNA), the LNA comprised of:
   an external bias control; coupled to,
   a gate voltage bias circuit, which mirrors its gate voltage to,
   a multi-stage pHEMPT amplifier (GaAs) module;
   wherein the gate voltage bias circuit comprises:
      a transistor having a gate terminal, a drain terminal, and a source terminal; the transistor coupled its gate terminal to a gate terminal of
      an amplifier transistor through at least one pass transistor of at least one stage amplifier and through an input impedance matching network, whereby a current mirror provides a gate bias voltage value to each stage amplifier; the gate terminal of the transistor further coupled through a diode circuit to a temperature compensation current source and to its drain terminal; the gate terminal of the transistor further coupled through a resistor to negative voltage; and the gate voltage bias circuit further coupled to ground at its source terminal.

3. A mixed technology Low Noise Amplifier (LNA), the LNA comprised of:
   an external bias control; coupled to,
   a gate voltage bias circuit, which mirrors its gate voltage to,
   a multi-stage pHEMPT amplifier (GaAs) module;
   wherein each pHEMPT stage amplifier comprises:
      a pHEMPT amplifier transistor having a gate terminal a drain terminal and a source terminal the pHEMPT amplifier transistor coupled to ground at its source terminal and coupled to an output impedance matching network (Zout) at its drain terminal;
      a pass transistor having a gate terminal, a drain terminal, and a source terminal; the pass transistor coupled at its source terminal to the gate terminal of the pHEMPT amplifier transistor by an input impedance matching network (Zin) and coupled at its drain terminal to a gate terminal of the gate voltage bias circuit; said input impedance matching network (Zin) of the stage amplifier further coupled to an amplifier input connector; the pass transistor further coupled at its gate terminal to a control voltage connector and through a diode circuit to its source terminal; and the output impedance matching network Zout further coupled to Vcc and to an amplifier output connector.

* * * * *